(12) United States Patent
Nguyen et al.

(10) Patent No.: US 6,248,252 B1
(45) Date of Patent: Jun. 19, 2001

(54) METHOD OF FABRICATING SUB-MICRON METAL LINES

(75) Inventors: Thien T. Nguyen, Austin; Mark I. Gardner, Cedar Creek, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/256,541

(22) Filed: Feb. 24, 1999

(51) Int. Cl.$^7$ ................. C23F 1/00; B44C 1/22
(52) U.S. Cl. ............... 216/77; 216/58; 216/67; 216/70; 420/529
(58) Field of Search ............... 420/529; 216/58, 216/77, 67, 70

(56) References Cited

U.S. PATENT DOCUMENTS

| | | | |
|---|---|---|---|
| 4,786,361 | * 11/1988 | Sekine et al. | 156/643 |
| 4,838,992 | * 6/1989 | Abraham | 156/643 |
| 5,772,906 | * 6/1998 | Abraham | 216/72 |
| 5,795,829 | * 8/1998 | Shen | 438/694 |
| 5,849,641 | * 12/1998 | Arnett et al. | 438/734 |
| 6,025,268 | * 2/2000 | Shen | 438/669 |

OTHER PUBLICATIONS

Stanley Wolf and Richard N. Tauber; *Silicon Processing for the VLSI Era, vol. 1—Process Technology*; pp. 332–334 and 559–564; 1986.

Stanley Wolf and Richard N. Tauber; *Silicon Processing for the VLSI Era, vol. 2—Process Integration*; p. 191; 1990.

\* cited by examiner

*Primary Examiner*—Randy Gulakowski
*Assistant Examiner*—Michael Kornakov
(74) *Attorney, Agent, or Firm*—Timothy M. Honeycutt

(57) ABSTRACT

Methods of fabricating interconnects of aluminum and aluminum alloys are provided. In one aspect, a method is provided for fabricating an interconnect of aluminum-containing material on a surface. A layer of aluminum-containing material is deposited on the surface. The layer of aluminum-containing material is masked with selected portions thereof left exposed. A first etch of the exposed portions is performed in a plasma ambient containing $BCl_3$, $Cl_2$, $N_2$ and $CF_4$ to establish a plurality of trenches having inwardly sloping sidewalls. An overetch of the exposed portions is performed to the surface in a plasma ambient. High aspect ratio lines may be formed with sloped sidewalls that facilitate subsequent interlevel dielectric formation.

26 Claims, 2 Drawing Sheets

METHOD OF FABRICATING SUB-MICRON METAL LINES

BACKGROUND OF THE INVENTION

1. Field of the Invention

This invention relates generally to semiconductor processing, and more particularly to a method of fabricating metal lines and trenches separating metal lines.

2. Description of the Related Art

The implementation of integrated circuits involves connecting isolated circuit devices through specific electrical pathways. Where integrated circuits are implemented in silicon, it is necessary, therefore, to initially isolate the various circuit devices built into the silicon substrate from one another. The circuit devices are thereafter interconnected to create specific circuit configurations through the use of global interconnect or metallization layers and local interconnect layers.

A global interconnect or metallization layer consists of a plurality of conductor lines or traces separated by grooves or trenches that are filled with an insulating material such as silicon dioxide, various types of glasses or one of many polymeric materials commonly used for interlevel dielectric layers. Various types of conductor materials have been historically used for global interconnect layers, the most common of these being aluminum, either in relatively pure form or mixed with small percentages of another conducting material, such as copper. Aluminum has been widely employed as a global interconnect material, due to its relatively good adherence to silicon and silicon dioxide structures, acceptable sheet resistance and low cost.

In most conventional methods for fabricating an aluminum global interconnect layer, a semiconductor wafer is blanket coated with a layer of aluminum by chemical vapor deposition ("CVD") or physical vapor deposition ("PVD"). The aluminum layer is then masked with a photoresist that is patterned, that is, exposed and developed, to cover the portions of the aluminum layer that will remain and constitute the individual conductor lines following a subsequent etch of the exposed portions of the aluminum. Where the critical dimension for the process used to pattern the aluminum will be less than about one micron, an anti-reflective coating layer is frequently applied to the upper surface of the aluminum layer prior to application and patterning of the resist. Following patterning of the photoresist, the exposed portions of the aluminum layer are etched down to the underlying subsurface, which is ordinarily the upper surface of an interlevel dielectric layer but may also be an underlying conductor layer and/or diffusion barrier. Dry anisotropic etching is frequently used to etch the aluminum layer. In most cases, the combination of the chemistry used to anisotropically etch the aluminum and the liberation of resist particles during the etch yields trenches between adjacent metal lines with nearly vertical sidewalls.

There are several disadvantages associated with conventional methods of patterning aluminum global interconnect layers. Many of these disadvantages can be traced to difficulties introduced into semiconductor fabrication as the result of increased packing density in design rules. The patterning of global aluminum interconnect layers in sub-0.3 $\mu$m technology frequently requires the etching of aluminum at very high aspect ratios, sometimes greater than 3:1 or 4:1. Such high aspect ratios combined with the relatively small lateral dimensions of trenches between adjacent metal lines can lead to significant problems during subsequent interlevel dielectric layer deposition processes. The difficulty stems from the fact that subsequently applied interlevel dielectric layers may not sufficiently adhere to the bottom corners of such high aspect ratio trenches and thus result in voids in, and/or cracking of, the interlevel dielectric material at the corners, which can lead to a variety of conductivity problems. The nearly vertical sidewalls established by most conventional aluminum etching processes does not favor dielectric adhesion and thus exacerbates the potential for void and/or cracked formation.

Another disadvantage associated with conventional aluminum processing is the limitation on critical dimension imposed by the photolithographic limit of the prevailing photolithographic patterning technology. The fabrication of increasingly smaller features in integrated circuits is dependent on the availability of increasingly higher resolution optical lithography equipment. Designers of optical lithography equipment have employed several techniques to combat the deleterious effects of light diffraction. Some of these techniques include decreasing the wave length of the illuminating light, increasing the numerical aperture of the system, increasing the contrast of the resist by modifying resist chemistry or by creating entirely new resists, and adjusting the coherence of the optical system. Even with the availability of these various techniques for increasing the resolution of optical lithography equipment, the best of conventional optical lithography systems have a resolution limit of about 0.2 $\mu$m when used in conjunction with resists in the 1.0 $\mu$m or greater range are used, and may still produce images with bridged patterns due to depth of focus limitations. Accordingly, the effective critical dimension between metal lines using conventional etching techniques and lithographic patterning processes is about 0.3 $\mu$m. Packing density for metallization is thus limited to these geometries in the absence of techniques for working around the limitations in optics.

The present invention is directed to overcoming or reducing the effects of one or more of the foregoing disadvantages.

SUMMARY OF THE INVENTION

In accordance with one aspect of the present invention, a method of forming a trench with inwardly sloping sidewalls in a layer of aluminum-containing material is provided. The layer of aluminum-containing material is masked with a portion thereof left exposed. A first etch of the exposed portion is performed in a plasma ambient containing $BCl_3$, $Cl_2$, $N_2$ and $CF_4$. An overetch of the exposed portion is performed in a plasma ambient.

In accordance with another aspect of the present invention, a method of fabricating an interconnect of aluminum-containing material on a surface is provided. A layer of aluminum-containing material is deposited on the surface. The layer of aluminum-containing material is masked with selected portions thereof left exposed. A first etch of the exposed portions is performed in a plasma ambient containing $BCl_3$, $Cl_2$, $N_2$ and $CF_4$ to establish a plurality of trenches having inwardly sloping sidewalls. An overetch of the exposed portions is performed to the surface in a plasma ambient.

In accordance with another aspect of the present invention, a method of forming a trench with inwardly sloping sidewalls in a layer of aluminum-containing material is provided. The layer of aluminum-containing material is masked with a portion thereof left exposed. A first etch of the exposed portion is performed in a plasma ambient containing $BCl_3$, $Cl_2$ and $CHF_3$. An overetch of the exposed portion is performed in a plasma ambient.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
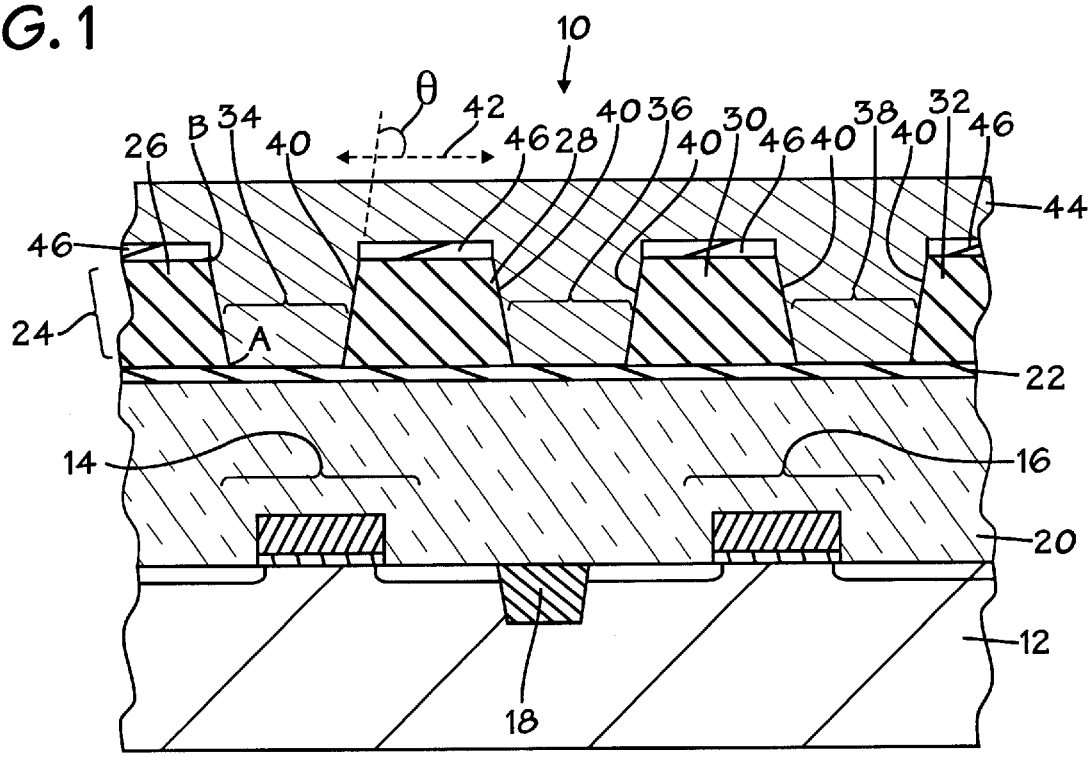
FIG. 1 is a highly magnified cross-sectional view of an exemplary embodiment of an integrated circuit including an interconnect layer in accordance with the present invention.

In the drawings described below, reference numerals are generally repeated where identical elements appear in more than one figure. FIG. 1 is a highly magnified cross-sectional view of a portion of an integrated circuit 10 implemented on a semiconductor substrate 12 composed of n-doped silicon, p-doped silicon, or other suitable substrate materials. The integrated circuit 10 includes a plurality of circuit devices, two of which are shown and depicted as field effect transistors 14 and 16 that are separated laterally by an isolation structure 18, which may be a trench isolation structure, a field oxide region or the like. The transistors 14 and 16 are coated with an interlevel dielectric layer 20 that is capped with a conductor layer 22. An interconnect layer 24 is positioned on the conductor layer 22 and consists of a plurality of spaced conductor lines or traces, four of which are visible and designated 26, 28, 30 and 32. The conductor layer 22 is provided as a diffusion barrier and to reduce the series resistance between the lines 26, 28, 30 and 32 and various contacts to the transistors 14 and 16 that are not visible FIG. 1. As described more fully below, the lines 26, 28, 30 and 32 are defined by a plurality of trenches 34, 36 and 38 which are formed with inwardly sloping sidewalls, collectively designated 40. The phrase "inwardly sloping" is intended to mean that a given trench, such as the trench 34, is narrower at its bottom, represented by the point A, than at its top, represented by the point B. The sidewalls 40 are formed with a slope of angle θ with respect to a horizontal plane of the substrate 12 as represented by the dashed line 42.

An interlevel dielectric layer 44 fills the trenches 34, 36 and 38 and overlies the conductor lines 26, 28, 30 and 32. The tops of the conductor lines 26, 28, 30 and 32 are capped with an anti-reflective coating 46 that is applied to aid in the subsequent lithographic patterning of a resist mask applied to pattern the conductor lines 26, 28, 30 and 32 as described more fully below.

Figure 2:
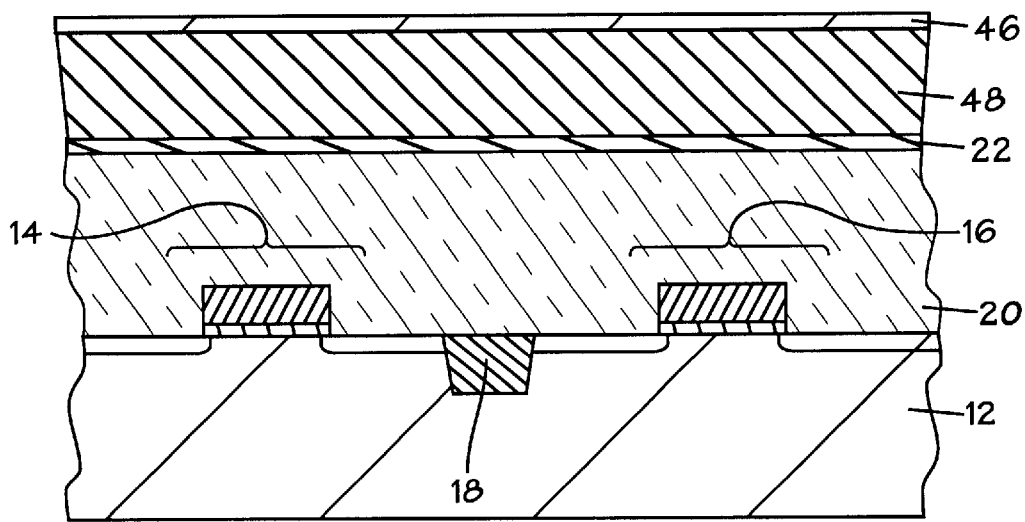
FIG. 2 is a cross-sectional view of a semiconductor substrate and depicts formation of a conductor layer thereon in accordance with the present invention.
Figure 3:
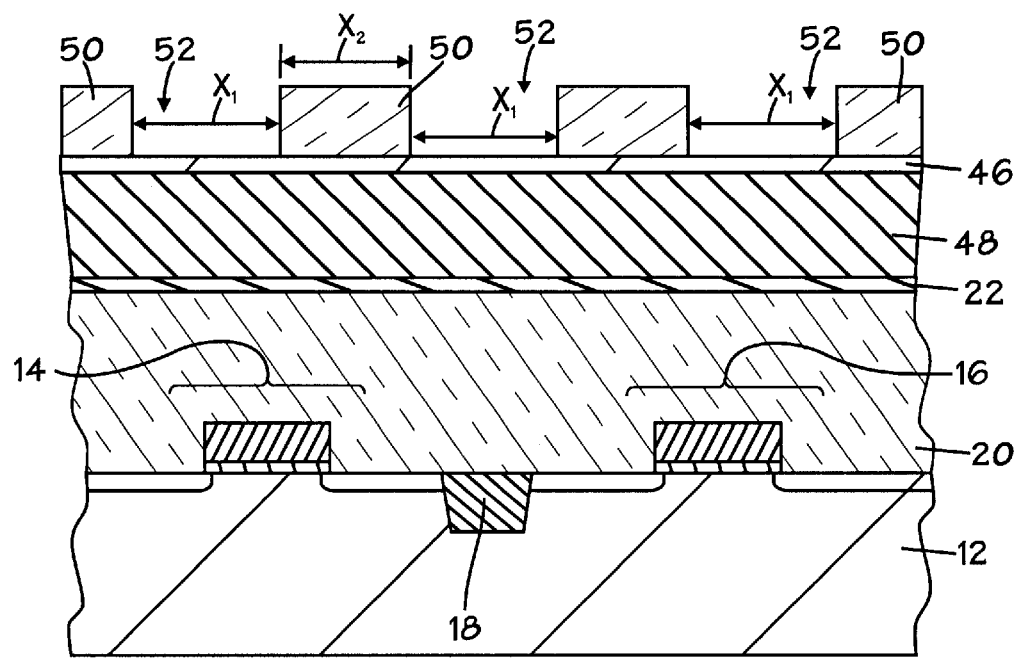
FIG. 3 is a cross-sectional view like FIG. 2 depicting application and patterning of a mask on the conductor layer in accordance with the present invention.
Figure 4:
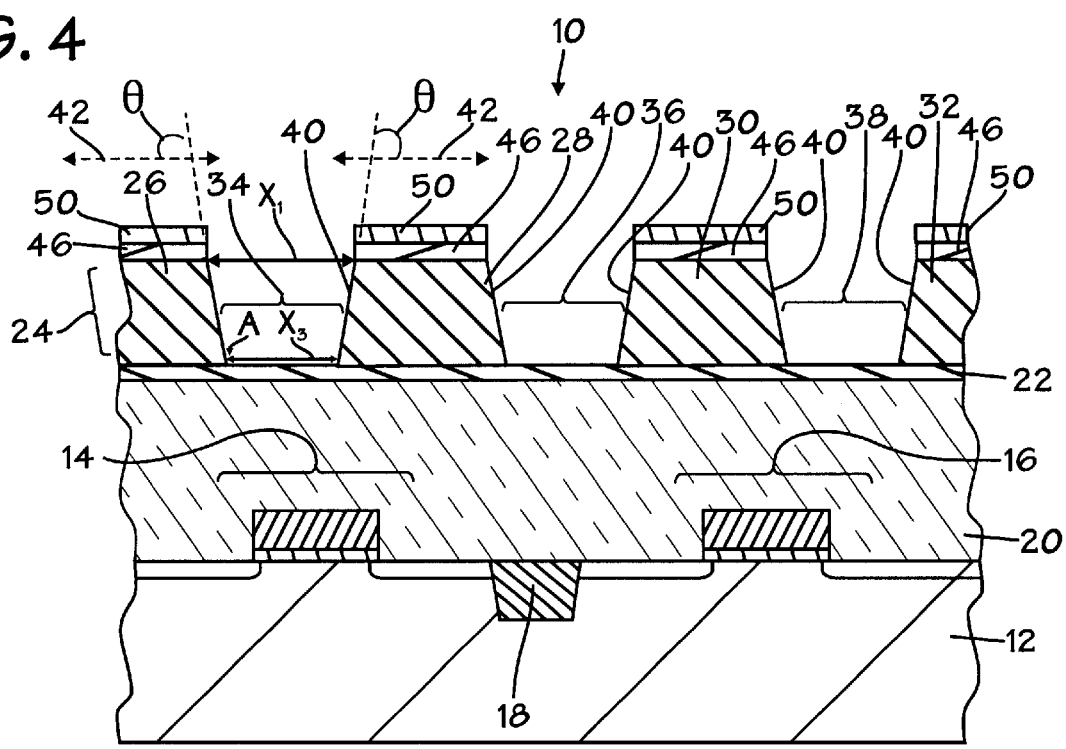
FIG. 4 is a cross-sectional view like FIG. 3 depicting anisotropic etching of the conductor layer to define a plurality of conductor lines in accordance with the present invention.

An exemplary process flow for fabricating the interconnect layer 24 in accordance with the present invention may be understood by referring now to FIGS. 2, 3 and 4, and initially to FIG. 2. The process will be described using the transistors 14 and 16 for context. However, it should be understood that the process of fabricating the interconnect layer 24 shown in FIG. 1 is not tied to any particularized underlying circuit structure. Preliminarily, the transistors 14 and 16 may be formed on the semiconductor substrate 12 using well know fabrication techniques. As used herein, the terms "formed on", "disposed on" or "positioned on" should be construed to include the possibility that a given layer or structure may be formed on another given layer or structure with a third or other intervening layers or structures disposed between the two. The interlevel dielectric layer 20 is next applied and planarized to a desired thickness. The layer 20 may be composed of a variety of commonly used interlevel dielectric layer materials, such as, for example, silicon dioxide, tetra-ethyl-ortho-silicate ("TEOS"), or the like and may be applied by well known CVD techniques. As used herein, the phrase "composed of" is not intended to exclude the incorporation of other constituents in a given layer. The thickness of the layer 20 is largely a matter of design discretion. In an exemplary embodiment, the layer 20 may be about 0.6 to 2.5 μm in thickness. The planarization may be by chemical mechanical polishing, etchback planarization or the like. Any contacts (not shown) to the transistors 14 and 16 may be fabricated at this point.

The conductor layer 22 is formed on the interlevel dielectric layer 20 to serve as a diffusion barrier and to enhance the series resistance characteristics of the interconnect between the subsequently formed conductor lines 26, 28, 30 and 32 depicted in FIG. 1 and any contacts (not shown) leading to individual circuit components of the transistors 14 and 16, such as local interconnect straps, plugs or the like. The conductor layer 22 may be fabricated from a variety of conducting materials, such as, for example, titanium, titanium-tungsten, tantalum, or the like. In an exemplary embodiment, the conductor layer 22 is composed of titanium with a thickness of about 200 to 400 Å and may be applied using conventional well known PVD techniques. Optionally, the conductor layer 22 may be eliminated from the process where diffusion and sheet resistance will not be problematic.

Next, a layer 48 of aluminum-containing material is formed on the conductor layer 22. Through subsequent processing, the aluminum-containing layer 48 will be patterned to define the conductor lines 26, 28, 30 and 32 depicted in FIG. 1. The aluminum-containing material may be composed of relatively pure aluminum, or aluminum mixed with another constituent, such as, for example, copper, silicon, gold, silver, titanium or the like. In an exemplary embodiment, the layer 48 is composed of aluminum mixed with about 1 wt % copper. The layer 48 may be about 0.5 to 1.2 μm in thickness and may be applied by blanket PVD or other known techniques for depositing aluminum films.

The aluminum-containing layer 48 is capped with an anti-reflective coating ("ARC") 46 to aid in the resolution of a subsequent photolithographic patterning step. The ARC layer 46 may be composed of a variety of ARC materials, such as, for example, TiN, $SiO_2$, or the like. In an exemplary embodiment, the ARC layer 46 is composed of TiN and may be formed with a thickness of about 800 to 1500 Å. The TiN may be applied by well know techniques, such as PVD deposition of titanium with subsequent or simultaneous nitrogen anneal. Optionally, the ARC layer 46 may be eliminated where reflection-induced interference effects are not anticipated, such as in processing at geometries larger than about 1.5 μm.

Referring now to FIG. 3, a photomask 50 is formed on the ARC layer 46 and patterned to leave portions of the ARC layer 46 and the underlying aluminum-containing layer 48 exposed where subsequent etching will establish the trenches 34, 36 and 38 depicted in FIG. 1. The gaps in the resist 50, collectively designated 52, are patterned with a lateral dimension $X_1$ that determines the lateral dimension of the tops of the trenches 34, 36 and 38. The dimension $X_1$ may be the minimum feature size for the lithographic patterning system used to expose the resist 50 or may be larger than the minimum feature size as desired. Note also that the lateral dimension $X_2$ of the remaining portions of the resist 50 determines the widths of the tops of the later-formed conductor lines 26, 28, 30 and 32. As with the widths of the trenches 34, 36 and 38, the dimension $X_2$ may be greater than or equal to the minimum feature size as desired. A variety of types of resist may be appropriately applied, such as, for example, UV resist, I-line resist or the like, depending upon the particular illuminating radiation used to expose the resist. Optionally, another masking material may be used in lieu of resist.

The fabrication of the trenches 34, 36 and 38 and the resultant definition of the conductor lines 26, 28, 30 and 32 depicted in FIG. 1 may be understood by referring now to FIGS. 3 and 4. The trenches 34, 36 and 38 are advantageously formed by dry anisotropic etching of the aluminum layer 48 depicted in FIG. 3 using an etch chemistry that will yield the sloped sidewalls 40 with the slope angle θ. The etch of the trenches 34, 36 and 38 is advantageously performed in a plasma etch tool with a 13.56 megahertz frequency diode system capable of reactive ion etching with or without magnetic enhancement. A two-step etch process is employed consisting of a first or main etch step followed by a second or overetch step. The main etch may be performed at a pressure of about 280 to 420 mtorr, a power setting of about 600 to 900 watts, with a plate spacing of about 2.0 to 2.5 cm and a magnetic field of about 8 to 12 Gauss. The etch mixture consists of $BCl_3$, $Cl_2$, $N_2$ and $CF_4$. The proportions of $BCl_3$, $Cl_2$, $N_2$ and $CF_4$ in the mixture, expressed in terms of volume percentages, may be about 42 to 62 vol % $BCl_3$, about 19 to 35 vol % $Cl_2$, about 13 to 24 vol % $N_2$ and about 3 to 6 vol % $CF_4$. In a more specific example, the main etch may be performed at about 350 mtorr, with a power setting of about 750 watts, a plate spacing of about 0.9 cm, an etchant mixture of about 88 cc of $BCl_3$, about 44 cc of $Cl_2$, about 30 cc of $N_2$ and about 7 cc of $CF_4$, and a magnetic field of 10 Gauss. End-point detection for the main etch may be by emission spectroscopy queued to a drop off in the 386 nm range.

The overetch may be performed at a pressure of about 200 to 300 mtorr, a power setting of about 600 to 900 watts, with a plate spacing of about 2.0 to 2.5 cm and a magnetic field of about 8 to 12 Gauss. The etch mixture consists of about 38 to 58 vol % $BCl_3$, about 10 to 20 vol % $Cl_2$, about 29 to 39 vol % $N_2$, and about 6 to 12 vol % $CF_4$. In a more specific example, the overetch may be performed at about 250 mtorr, with a power setting of about 750 watts, a plate spacing of about 0.9 cm, an etch mixture of about 40 cc $BCl_3$, about 12 cc $Cl_2$, about 25 cc $N_2$ and about 7 cc $CF_4$, and a magnetic field of 10 Gauss. The overetch is performed for about 15 to 30 seconds.

If desired, an initial breakthrough etch may be performed to anisotropically etch through the ARC layer 46. This etch may be performed with a plate power of about 850 watts and a pressure of about 120 to 180 mtorr. The etchant mixture may contain about 77 to 88 volume percent $BCl_3$ and about 12 to 23 volume percent $Cl_2$. The breakthrough etch may be performed without magnetic enhancement.

The etch process in accordance with the present invention establishes the sidewalls 40 with an angle θ of about 75 to 85°. Sidewall passivation during the main and overetch etches, and the breakthrough etch if performed, is provided by the combination of $BCl_3$, $N_2$ and $CF_4$. The $BCl_3$ is a relatively large molecule that provides excellent ionic bombardment of the etched surfaces. Significant sputtering removes CuCl etch products from the etched surfaces, and liberates particles of the resist layer 50 into the ambient that, in conjunction with the nitrogen in the ambient, provide excellent sidewall film passivation. The $BCl_3$ constituent also reduces any native $Al_2O_3$ film on the aluminum-containing layer 48 which might otherwise prevent the $Cl_2$ from reacting with aluminum. The $CF_4$ component of the mixture attacks any passivating material forming in the bottoms of the trenches 34, 36 and 38 that might otherwise prevent reaction between $Cl_2$ and the aluminum-containing material.

Optionally, sidewall passivation may be provided by replacing the combination of $CF_4$ and $N_2$ with $CHF_3$. The $CHF_3$ may be added in the same basic volume percentages as the aforementioned combination of $CF_4$ and $N_2$.

A variety of available etch tools may be employed to define the trenches 34, 36 and 38. For example, an Applied Materials model MXP 5000 with magnetic enhancement may be used.

As the skilled artisan will appreciate, the sloped sidewalls 40 facilitate the subsequent adhesion of the interlevel dielectric layer 44 (See FIG. 1) that fills the trenches 34, 36 and 38. In this way, the potential for troublesome voids and/or cracking may be significantly reduced. In addition, and as shown in FIG. 4, the bottoms of the trenches 34, 36 and 38 will have a lateral dimension $X_3$ that is less than the lateral dimension $X_1$ at the tops of the trenches 34, 36 and 38. Thus, the trenches 34, 36 and 38 may be formed with an effective lateral dimension $X_3$ that is smaller than the minimum feature size that may be patterned using the available lithographic patterning technology used to pattern the resist layer 50. Packing density may be increased in advance of technological advances in microlithography. An additional benefit is the fabrication of conductor lines with trapezoidal-like cross-sections. The relatively wider bases of such lines exhibit lower contact resistance than conventionally fabricated lines with vertical sidewalls.

Referring now to FIGS. 1 and 4, the resist layer 50 shown in FIG. 4 may be stripped by ashing and the interlevel dielectric layer 44 may be fabricated by blanket depositing an insulating material in the trenches 34, 36 and 38 and over the lines 26, 28, 30 and 32. The insulating material may be silicon dioxide, TEOS, spin-on-glass or the like, and may be deposited by well known CVD or spin-on techniques. Following deposition, the layer 44 is planarized by etchback planarization, CMP or the like, to yield the completed structure as shown in FIG. 1.

The skilled artisan will appreciate that the process of the present invention enables fabrication of aluminum and aluminum-copper conductor lines with very narrow spacing, correspondingly high aspect ratios, and substantially reduced potential for interlevel dielectric layer crack and void formation. The reliability of conductor lines patterned using the process of the present invention is enhanced and packing density is increased as trenches may be formed with effective lateral dimensions that may be smaller than the minimum feature size available using the prevailing lithographic patterning systems.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of forming a trench with inwardly sloping sidewalls in a layer of aluminum-containing material, comprising:

masking the layer of aluminum-containing material, leaving a portion thereof exposed;

performing a first etch of the exposed portion in a plasma ambient containing $BCl_3$, $Cl_2$, $N_2$ and $CF_4$; and performing an overetch of the exposed portion in a plasma ambient.

2. The method of claim 1, wherein the first etch ambient comprises about 42 to 62 volume % $BCl_3$, about 19 to 35 volume % $Cl_2$, about 13 to 24 volume % $N_2$ and about 3 to 6 volume % $CF_4$.

3. The method of claim 1, wherein the overetch is performed with an ambient containing $BCl_3$, $Cl_2$, $N_2$ and $CF_4$.

4. The method of claim 3, wherein the overetch ambient comprises about 38 to 58 volume % $BCl_3$, about 10 to 20 volume % $Cl_2$, about 22 to 39 volume % $N_2$ and about 6 to 12 volume % $CF_4$.

5. The method of claim 1, wherein the first etch and the overetch are performed using magnetically enhanced reactive ion etching.

6. The method of claim 1, wherein the first etch is performed at a pressure of about 280 to 420 mtorr and the overetch is performed at a pressure of about 200 to 300 mtorr.

7. The method of claim 1, wherein the layer of aluminum-containing material comprises aluminum containing about 1% copper.

8. A method of fabricating an interconnect of aluminum-containing material on a surface, comprising:

depositing a layer of aluminum-containing material on the surface;

masking the layer of aluminum-containing material, leaving selected portions thereof exposed;

performing a first etch of the exposed portions in a plasma ambient containing $BCl_3$, $Cl_2$, $N_2$ and $CF_4$ to establish a plurality of trenches having inwardly sloping sidewalls; and performing an overetch of the exposed portions to the surface in a plasma ambient.

9. The method of claim 8, comprising forming an anti-reflective coating on the layer of aluminum-containing material prior to masking the layer of aluminum-containing material, and etching the anti-reflective coating prior to performing the first etch.

10. The method of claim 9, wherein the etching of the anti-reflective coating is performed with an ambient containing about 77 to 88 volume % BCl3 and about 12 to 23 volume % $Cl_2$.

11. The method of claim 8, wherein the first etch ambient comprises about 42 to 62 volume % $BCl_3$, about 19 to 35 volume % $Cl_2$, about 13–24 volume % $N_2$ and about 3 to 6 volume % $CF_4$.

12. The method of claim 8, wherein the overetch is performed with an ambient containing $BCl_3$, $Cl_2$, $N_2$ and $CF_4$.

13. The method of claim 12, wherein the overetch ambient comprises about 38 to 58 volume % $BCl_3$, about 10 to 20 volume % $Cl_2$, about 22 to 39 volume % $N_2$ and about 6 to 12 volume % $CF_4$.

14. The method of claim 8, wherein the first etch and the overetch are performed using magnetically enhanced reactive ion etching.

15. The method of claim 8, wherein the first etch is performed at a pressure of about 280 to 420 mtorr and the overetch is performed at a pressure of about 200 to 300 mtorr.

16. The method of claim 8, wherein the layer of aluminum-containing material comprises aluminum containing about 1% copper.

17. The method of claim 8, comprising filling the trenches with an insulating material.

18. The method of claim 16, wherein the surface comprises a layer of titanium.

19. The method of claim 10, wherein the etch of the anti-reflective coating is performed at a pressure of about 120 to 180 mtorr.

20. A method of forming a trench in a layer of aluminum-containing material, comprising:

masking the layer of aluminum-containing material, leaving a portion thereof exposed;

performing a first etch of the exposed portion in a plasma ambient containing $BCl_3$, $Cl_2$ and $CHF_3$; and performing an overetch of the exposed portion in a plasma ambient, the first etch and the overetch being performed at a pressure sufficient to establish the trench with inwardly sloping sidewalls.

21. The method of claim 20, wherein the first etch ambient comprises about 42 to 62 volume % $BCl_3$, about 19 to 35 volume % $Cl_2$, and about 19 to 39 volume % $CHF_3$.

22. The method of claim 20, wherein the overetch is performed with an ambient containing $BCl_3$, $Cl_2$ and $CHF_3$.

23. The method of claim 22, wherein the overetch ambient comprises about 38 to 58 volume % $BCl_3$, about 10 to 20 volume % $Cl_2$, about 32 to 52 volume % $CHF_3$.

24. The method of claim 20, wherein the first etch and the overetch are performed using magnetically enhanced reactive ion etching.

25. The method of claim 20, wherein the first etch is performed at a pressure of about 280 to 420 mtorr and the overetch is performed at a pressure of about 200 to 300 mtorr.

26. The method of claim 20, wherein the layer of aluminum-containing material comprises aluminum containing about 1% copper.

* * * * *